(12) United States Patent
Sanji et al.

(10) Patent No.: US 11,147,201 B2
(45) Date of Patent: Oct. 12, 2021

(54) COMPONENT MOUNTING DEVICE

(71) Applicant: FUJI CORPORATION, Chiryu (JP)

(72) Inventors: Mitsuru Sanji, Toyota (JP); Kenji Hara, Kariya (JP)

(73) Assignee: FUJI CORPORATION, Chiryu (JP)

( * ) Notice: Subject to any disclaimer, the term of this patent is extended or adjusted under 35 U.S.C. 154(b) by 85 days.

(21) Appl. No.: 16/339,045

(22) PCT Filed: Oct. 6, 2016

(86) PCT No.: PCT/JP2016/079787
§ 371 (c)(1),
(2) Date: Apr. 3, 2019

(87) PCT Pub. No.: WO2018/066107
PCT Pub. Date: Apr. 12, 2018

(65) Prior Publication Data
US 2020/0045863 A1 Feb. 6, 2020

(51) Int. Cl.
*H05K 13/08* (2006.01)
*H05K 13/04* (2006.01)
*G05B 19/406* (2006.01)

(52) U.S. Cl.
CPC ....... *H05K 13/0882* (2018.08); *G05B 19/406* (2013.01); *H05K 13/0409* (2018.08); *H05K 13/0812* (2018.08); *G05B 2219/37216* (2013.01)

(58) Field of Classification Search
CPC ........... H05K 13/0882; H05K 13/0409; H05K 13/0812; H05K 13/08; G05B 19/406; G05B 2219/37216
See application file for complete search history.

(56) References Cited

U.S. PATENT DOCUMENTS

| 2013/0010101 A1* | 1/2013 | Yamasaki | H05K 13/0812 348/92 |
| 2015/0235356 A1* | 8/2015 | Esaki | H01Q 1/2258 382/141 |
| 2017/0308963 A1* | 10/2017 | Takehara | G06Q 10/063112 |

FOREIGN PATENT DOCUMENTS

JP  2015-135886 A  7/2015

OTHER PUBLICATIONS

International Search Report dated Jan. 10, 2017 in PCT/JP2016/079787 filed Oct. 6, 2016.

* cited by examiner

*Primary Examiner* — Thomas C Lee
*Assistant Examiner* — Charles Cai
(74) *Attorney, Agent, or Firm* — Oblon, McClelland, Maier & Neustadt, L.L.P.

(57) ABSTRACT

In the component mounting device, a control device includes a model data storage section for storing model data related to a component, an error determining section for determining whether a processing error has occurred, and a confirmation-necessity storage section for storing whether confirmation of the validity of the model data is necessary when the processing error has occurred in a series of processes performed based on each piece of model data stored in the model data storage section. When it is determined that a processing error has occurred, the control device temporarily suspends the operation of the component transfer device when the model data, related to the target component held by the component transfer device, stored in the confirmation-necessity storage section indicates that confirmation is necessary, but continues the operation of the component transfer device when the model data stored in the confirmation-necessity storage section indicates that confirmation is unnecessary.

6 Claims, 5 Drawing Sheets

COMPONENT MOUNTING DEVICE

TECHNICAL FIELD

The present application relates to a component mounting device.

BACKGROUND ART

Patent Literature 1 discloses a component mounting device that performs image processing by capturing an image of a component picked up by a suction nozzle with a component camera to compare the captured image of the component with image processing data stored in advance. In the image processing performed by the component mounting device described in Patent Literature 1, it is determined that the component is defective and an image processing error occurs, when the shape of the component or the pickup position of the component by the suction nozzle is not within a predetermined allowable range.

PATENT LITERATURE

Patent Literature 1: JP-A-2015-135886

BRIEF SUMMARY

Technical Problem

In the prior art described above, when component mounting work by the component mounting device is started, there are cases in which image processing data or the like used for image processing includes data for which validity is unconfirmed. In such a case, testing for confirming validity of the data is performed before starting component mounting work. However, because this means that component mounting work cannot start until completion of the testing, productivity of component mounting work is made worse.

It is an object of the present disclosure to provide a component mounting device for which productivity is improved.

Solution to Problem

The component mounting device of the present disclosure includes a component transfer device for holding a supplied component and mounting the component on a conveyed board, an imaging device for imaging the component or the board, and a control device for controlling the component transfer device. The control device includes: a model data storage section configured to store model data produced based on information about the component; an error determining section configured to determine whether a processing error has occurred in a series of processes from the start of the holding operation of the component to the completion of mounting, and a confirmation-necessity storage section configured to store information about whether confirmation of validity of the model data is necessary when a processing error has occurred in the series of processes performed based on each piece of model data stored in the model data storage section.

When it is determined that the processing error has occurred, the control device temporarily suspends the mounting operation by the component transfer device in a case of the model data, which is related to the target component held by the component transfer device and is stored in the confirmation-necessity storage section, indicating that confirmation of validity is necessary, or continues the mounting operation by the component transfer device in a case of the model data stored in the confirmation-necessity storage section indicating that confirmation of validity is unnecessary.

With the component mounting device of the present disclosure, the error determining section determines whether a processing error has occurred in the course of performing a series of processes from the start of the holding operation of the component to the mounting of the component by the component transfer device. Then, if a processing error occurs in the course of performing a series of processes based on model data that requires confirmation of validity, the control device deems the validity of the model data as suspect and temporarily suspends the operation of the component transfer device. This provides an opportunity to confirm the validity of the model data. On the other hand, if the error determining section determines that a processing error has not occurred, the control device deems the model data to be valid and continues the mounting operation by the component transfer device.

Consequently, since the component mounting device of the present disclosure does not need to perform testing to confirm the validity of the model data prior to starting component mounting work, productivity of the component mounting work is improved.

DESCRIPTION OF EMBODIMENTS

Configuration of Component Mounting Device 1

Figure 1:
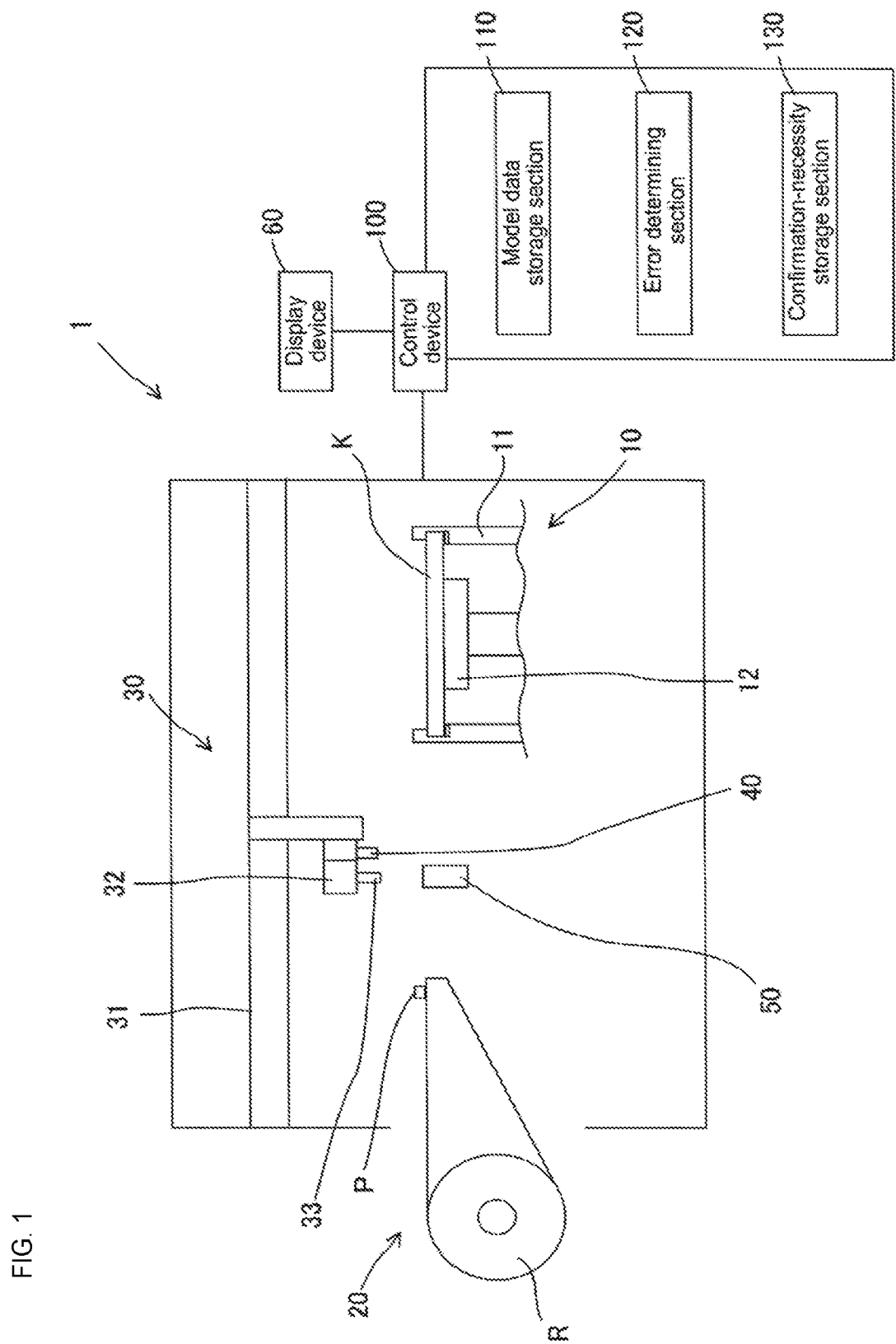
FIG. 1 is a schematic diagram of a component mounting device according to an embodiment of the present disclosure.

An embodiment to which the component mounting device according to the present disclosure is applied will be described below with reference to the drawings. First, referring to FIG. 1, a configuration of component mounting device 1 according to an embodiment of the present disclosure will be described. As shown in FIG. 1, component mounting device 1 mainly includes board conveyance device 10, component supply device 20, component transfer device 30, first imaging device 40, second imaging device 50, display device 60, and control device 100.

Board conveyance device 10 mainly includes conveyor 11 and clamping device 12. Conveyor 11 conveys board K, which is a mounting target for component P, to a board supply position. Clamping device 12 positions and fixes board K conveyed to the board supply position by conveyor 11. Component supply device 20 is composed of feeders or the like for supplying component P, stored on tape wound on reel R, to a component supply position.

Component transfer device 30 mainly includes XY-robot 31 and mounting head 32, and mounting head 32 is provided so as to be movable by XY-robot 31 in the horizontal direction. Suction nozzle 33 capable of holding component P by suction is mounted on mounting head 32. First imaging device 40 is a camera provided in XY-robot 31 and captures an image of board K positioned and fixed at the board supply position and component P supplied to the component supply position from above. Second imaging device 50 is a camera provided between board conveyance device 10 and component supply device 20, and captures an image of component P picked up by suction nozzle 33 from below.

Display device 60 is a touch panel type liquid crystal display that displays various information related to the mounting operation of component P by component mounting device 1, functioning as an input device that receives instructions from an operator.

Control device 100 performs general control over the operation of component mounting device 1, and is communicably connected to board conveyance device 10, component supply device 20, component transfer device 30, first imaging device 40, second imaging device 50, and display device 60.

Control Device 100

Control device 100 mainly includes model data storage section 110, error determining section 120, and confirmation-necessity storage section 130.

Model data storage section 110 stores model data produced on the basis of information about every component P mounted on board K. The model data includes image data indicating the outer shape of component P viewed from above, image data indicating the outer shape of component P viewed from below, and the like. The model data is used when control device 100 determines whether component P is a defective product, for example, in a series of processes from the start of the mounting operation of component P to the mounting of the component on board K.

Error determining section 120 determines whether a processing error has occurred in a series of processes from the start of the holding operation of component P by component transfer device 30 to the completion of the mounting of component P on board K. In the present embodiment, processing errors determined by error determining section 120 include pickup errors, dropped component errors, and component matching errors.

Pickup errors are errors indicating that component P is not properly picked up by suction nozzle 33 in the suction operation of component P supplied to component supply device 20. Dropped component errors are errors indicating that component P picked up by suction nozzle 33 has fallen during the process up to the moment of mounting component P on board K. An example of a method for determining the occurrence of a pickup error or a component dropped error is the detection of a change in negative pressure or flow rate of suction nozzle 33.

When a pickup error or a component dropped error occurs in the normal operation of component transfer device 30, control device 100 shifts to a recovery process. In the recovery process, after continuing the mounting operation of other components P supplied to component supply device 20, control device 100 performs the mounting operation of component P that has not been mounted due to a pickup error or a component dropped error. When a pickup error or a component dropped error occurs consecutively for a predetermined count number during the mounting operation on the same component P, control device 100 stops the mounting operation by component transfer device 30 and notifies the operator of the processing error. Examples of a method for sending out a notification regarding the occurrence of a processing error include using the display on display device 60, notifying with a warning sound, or the like.

Component matching errors are errors indicating that component imaging data and model data do not match upon imaging component P, picked up and held by suction nozzle 33, with second imaging device 50 and matching the captured component imaging data with the model data. In the normal operation of component transfer device 30, when a component matching error occurs, control device 100 determines that component P picked up by suction nozzle 33 is a defective product. Control device 100 then controls component transfer device 30, discards component P held by suction, and shifts to the recovery process.

When error determining section 120 determines that a processing error has occurred, confirmation-necessity storage section 130 stores whether the validity of model data stored in model data storage section 110 needs to be confirmed.

For example, there can be a situation in which the validity of model data related to component P, which is a new component without having been mounted on board K, is not confirmed as model data for use in determining the quality of component P. In this regard, conventionally, operators have performed testing to confirm the validity of the model data while performing a series of processes from the holding operation to the mounting operation only on new component P, and component mounting work is started after the validity of the model data has been confirmed.

On the other hand, in component mounting device 1, whether component P to be mounted on board K is a new component is stored in confirmation-necessity storage section 130, and control device 100 regards the model data related to component P that is a new component as model data requiring confirmation.

Therefore, when a processing error occurs, if component P to be picked up and held by suction nozzle 33 is a new component and is stored in confirmation-necessity storage section 130, control device 100 deems the validity of the model data as suspect and temporarily suspends the mounting operation by component transfer device 30. At this time, control device 100 notifies the operator. As a result, the operator can recognize that a processing error has occurred, in the course of performing a series of processes, based on model data that requires confirmation of validity. An opportunity to confirm the validity of the model data is given to the operator, to determine whether component P is defective or the model data needs to be corrected, which enables the operator to handle the situation based on the cause of the processing error.

Even when component P is not a new component, model data related to component P that the operator considers necessary can be stored in confirmation-necessity storage section 130 as model data that requires confirmation.

3: Processing Error Determination Process

Figure 2:
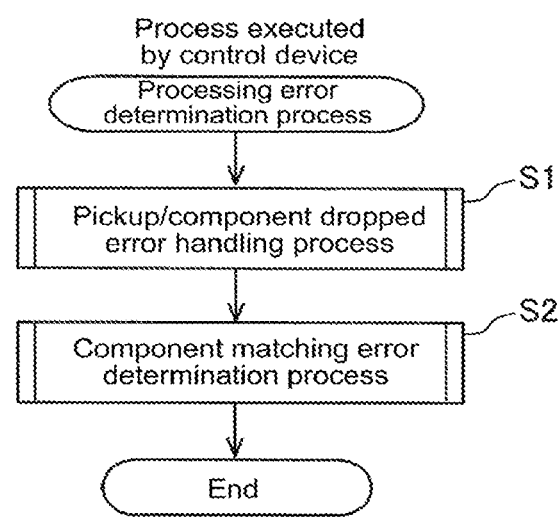
FIG. 2 is a flowchart showing a processing error determination process executed by a control device.
Figure 3:
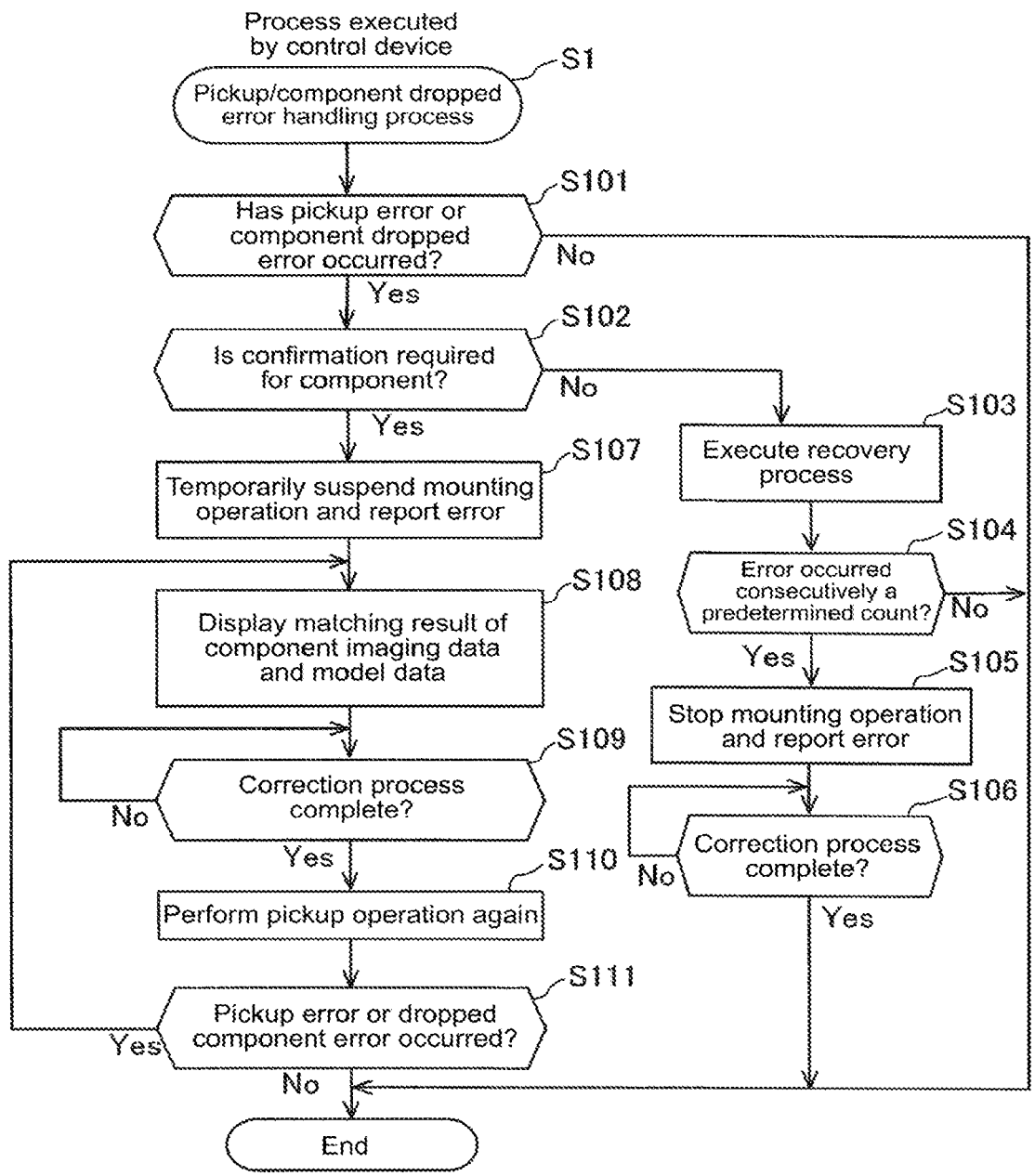
FIG. 3 is a flowchart showing a pickup error handling process executed by the control device.
Figure 4:
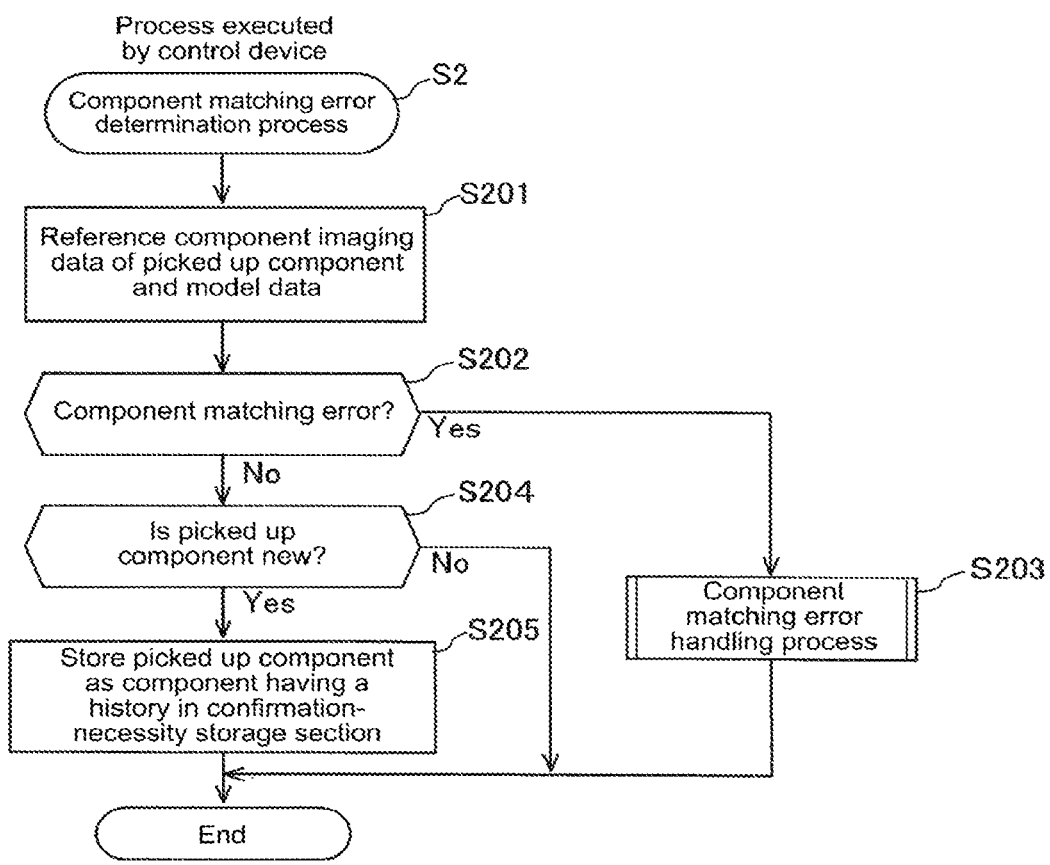
FIG. 4 is a flowchart showing a component matching error determination process executed by the control device.

Here, the processing error determination process executed by control device 100 will be described with reference to the flowcharts shown in FIGS. 2 to 4. As shown in FIG. 2, in the processing error determination process, control device 100 first performs a pickup/component dropped error handling process (S1), and then executes a component matching error determination process (S2).

3-1: Pickup/Component Dropped Error Handling Process

Next, with reference to the flowchart shown in FIG. 3, the pickup/component dropped error handling process (S1) executed in the processing error determination process will be described. As shown in FIG. 3, in the pickup/component dropped error handling process (S1), the error determining section 120 first determines whether a pickup error or a component dropped error has occurred (S101). If no pickup error or component dropped error has occurred (S101: No), control device 100 terminates the present process.

On the other hand, if a pickup error has occurred (S101: Yes), control device 100 determines whether component P to be picked up is registered in confirmation-necessity storage section 130 for confirmation being needed (S102). As a result, if it is unnecessary to confirm target component P (S102: No), the recovery process is executed (S103). Then, in the pickup holding operation of component P performed in the recovery process, if a pickup error or a component dropped error has not occurred consecutively for a predetermined count number (S104: No), the present process is terminated.

On the other hand, if it is determined in the process of S104 that a pickup error or a component dropped error has occurred consecutively for a predetermined count number (S104: Yes), control device 100 determines that some problem has occurred. Control device 100 stops the mounting operation of component transfer device 30 and sends out a notification regarding the occurrence of a pickup/component dropped error (S105). After the process of S105, control device 100 waits until the correction process for handling the error that has occurred is completed, and when completion of the correction process is detected (S106: Yes), the process is terminated.

Note that the processes of S103 to S106 are normal processes performed by control device 100 when a pickup error or a component dropped error occurs, and if it is unnecessary to confirm the model data related to component P to be picked up, control device 100 continues the mounting operation with component transfer device 30.

In the process of S102, if component P to be picked up is registered in confirmation-necessity storage section 130 as requiring confirmation (S102: Yes), control device 100 temporarily suspends the mounting operation of component transfer device 30, and sends out a notification regarding the occurrence of the pickup error (S107). Control device 100 displays a matching result of the component imaging data of component P imaged with first imaging device 40 and the model data indicating the outer shape of component P viewed from above on display device 60 (S108).

Thereafter, the operator verifies the cause of the pickup/component dropped error by referring to the matching result of the component imaging data and the model data. The operator then corrects the model data according to the verification result, for example, correction of the data related to the suction position of suction nozzle 33 with respect to component P (i.e., the position in the horizontal or vertical direction of suction nozzle 33 when the component P is picked up), adjustment of the movement speed of mounting head 32, and the like.

After the process of S108, control device 100 waits until data correction processing based on the verification result is completed. When completion of the correction process is detected (S109: Yes), control device 100 controls component transfer device 30 and executes the pickup holding operation of component P again (S110). As a result, if a pickup error does not occur (S111: No), it can be concluded that correction of the data was adequately performed, and the present process is terminated. On the other hand, if a pickup or holding error occurs again (S111: Yes), the process returns to S108.

As described above, in the pickup/component dropped error handling process, if a pickup/component dropped error occurs, if it is unnecessary to confirm component P to be picked up, control device 100 continues the normal mounting operation (i.e., the recovery process) by component transfer device 30. On the other hand, if component P to be picked up is component P requiring confirmation, control device 100 temporarily suspends the mounting operation by component transfer device 30 and provides an opportunity to confirm the validity of the model data.

Therefore, since component mounting device 1 does not need to perform testing to confirm the validity of the model data before starting component mounting work, productivity of the component mounting work is improved.

3-2: Component Matching Error Determination Process

Next, with reference to the flowchart shown in FIG. 4, a description will be given of a component matching error determination process (S2) executed in the processing error determination process. As shown in FIG. 4, in the component matching error determination process (S2), first, control device 100 matches the component image data of component P, being picked up and held by suction nozzle 33, by using second imaging device 50 with model data indicating the outer shape of component P viewed from below (S201).

As a result of the process of S201, when the component imaging data and the model data do not match with each other and error determining section 120 determines that a component matching error has occurred (202: Yes), the process proceeds to a process for handling component matching errors (S203). Details of the process for handling component matching errors (S203) will be described later with reference to FIG. 5.

On the other hand, as a result of the process of S202, when error determining section 120 determines that the component imaging data matches the model data and no component matching error have occurred (S202: Yes), control device 100 subsequently determines whether component P picked up and held by suction nozzle 33 is a new component, based on the stored information in confirmation-necessity storage section 130 (S204). If component P picked up and held by suction nozzle 33 is not a new component (S204: No), control device 100 skips the process of S205 and ends the process as it is.

On the other hand, in the process of S204, if component P picked up and held by suction nozzle 33 is a new component (S204: Yes), the model data related to component P is deemed as model data confirmed to be valid. Control device 100 then stores picked up component P in confirmation-necessity storage section 130 as component P having a history (S205) and terminates the present process. As a result, the model data related to picked up component P is stored in confirmation-necessity storage section 130 as model data for which confirmation of validity is unnecessary.

In this way, multiple confirmations of the validity of model data related to component P, which was a new component at the start of component mounting work, can be avoided. As a result, with respect to component P that was a new component at the start of component mounting work, when a component matching error occurs in the subsequent mounting operation, the control device 100 continues the normal mounting operation. In this way, component mounting device 1 improves the productivity of component mounting work.

3-3: Component Matching Error Handling Process

Figure 5:
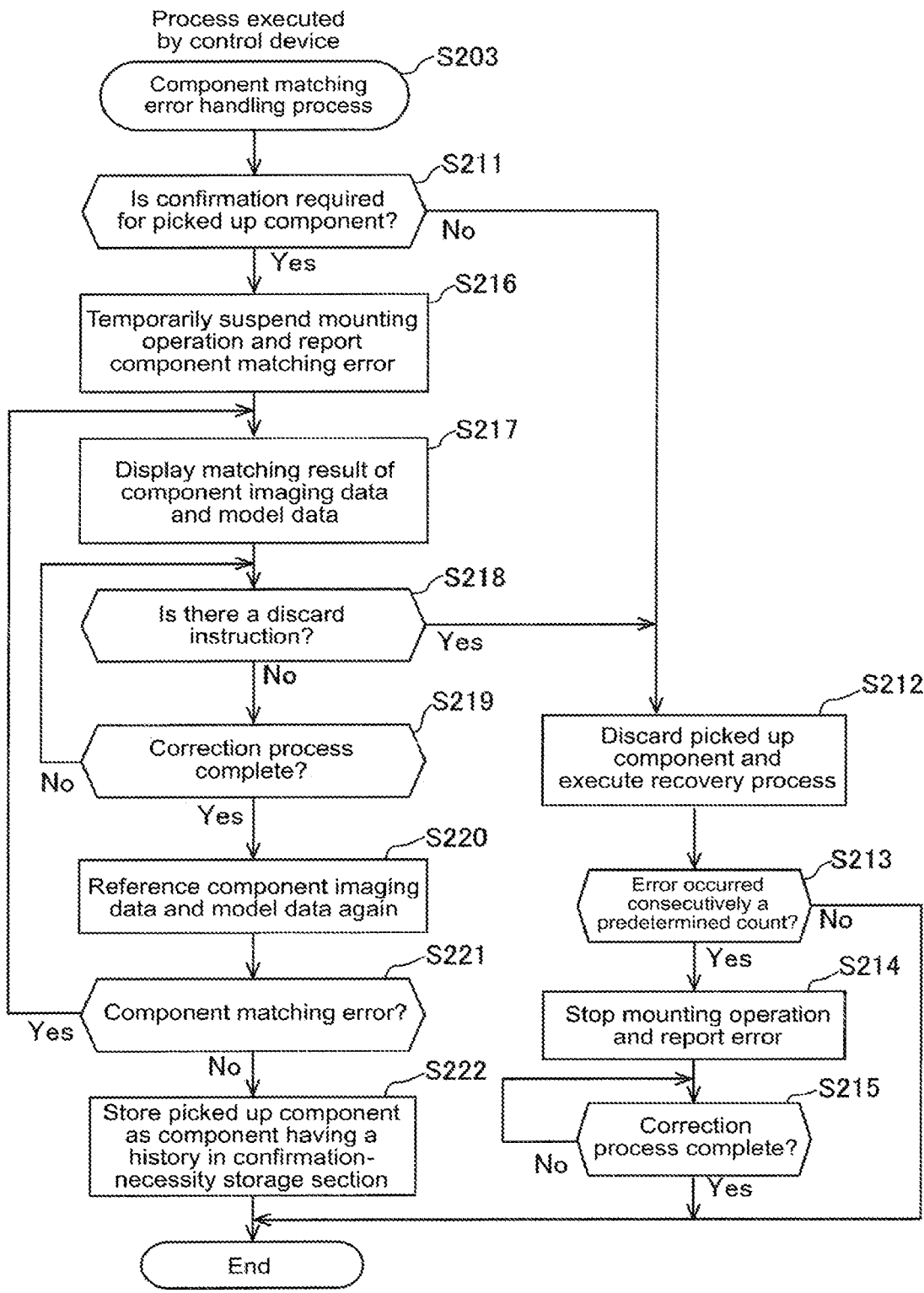
FIG. 5 is a flowchart showing a component matching error handling process executed by the control device.

Next, with reference to the flowchart shown in FIG. 5, the process for handling component matching errors (S203), which is executed in the component matching error determination process, will be described. As shown in FIG. 5, in the process for handling component matching errors (S203), first, control device 100 determines whether component P picked up and held by suction nozzle 33 is required for confirmation, based on the stored information in the confirmation-necessity storage section 130 (S211).

As a result of the process in S211, if it is unnecessary to confirm component P picked up and held by suction nozzle 33, control device 100 determines that component P picked up and held is a defective product. Accordingly, control device 100 performs, as a recovery process, a process for discarding picked up component P and holding new component P in place of discarded component P in component transfer device 30 again after mounting work for other components P is completed (S212). Thereafter, the component imaging data and the model data are referenced in the recovery process, and if a component matching error does not occur consecutively for a predetermined count number (S213: No), the present process is terminated as it is.

On the other hand, if it is determined in the process of S213 that a component matching error has occurred consecutively for a predetermined count number (S213: Yes), control device 100 determines that a failure of some kind has occurred. Control device 100 stops the mounting operation by component transfer device 30 and sends out a notification regarding the occurrence of a component matching error (S214). After the process of S214, control device 100 waits until a correction process for resolving the component matching error is completed, and when completion of the correction process is detected (S215: Yes), the process is terminated.

Note that the processes of S212 to S215 are normal processes performed by control section 100 when a component matching error occurs, and if it is unnecessary to confirm the model data related to component P picked up and held, control device 100 continues the mounting operation by component transfer device 30.

In the process of S211, if it is determined that component P picked up and held by suction nozzle 33 needs to be confirmed based on the stored information in confirmation-necessity storage section 130 (S211: Yes), control device 100 regards the model data related to component P picked up and held as model data having suspect validity. In step S216, control device 100 temporarily suspends operation of component transfer device 30 and sends out a notification that a component matching error has occurred with component P that is a new component. At this time, component transfer device 30 maintains a state in which component P is picked up and held by suction nozzle 33.

Control device 100 displays a matching result of the model data and the component image data of component P picked up and held on display device 60 (S217). This gives the operator an opportunity to confirm the validity of the model data. Thereafter, the operator verifies the cause of the component matching error by referring to the matching result of the component imaging data with the model data. The operator then determines whether component P is defective, corrects the model data, and the like in accordance with the verification result.

After the process of S217, control device 100 waits for an input from the operator. If the operator determines that component P is defective as a result of the verification, the operator instructs control device 100 to discard component P picked up by suction nozzle 33. On the other hand, if component P is a non-defective part, the operator corrects the model data in order to eliminate the component matching error.

If control device 100 is instructed to discard component P picked up by suction nozzle 33 (S218: Yes), the process proceeds to S212. That is, control device 100 determines that the determination result in the process of S202 in the component matching error determination process (S2) (i.e., the determination that a component matching error has occurred) is correct, and proceeds with the normal mounting operation with component transfer device 30.

On the other hand, if control device 100 detects the completion of the correction process of the model data (S219: Yes), the error determining section 120 again performs the referencing of the corrected model data and the component imaging data (S220). As a result, if a component matching error occurs again (S221: Yes), the process returns to S217 and an opportunity to confirm the validity of the model data is given again.

On the other hand, if no component matching error has occurred (S221: No), it can be concluded that data correction processing has been adequately performed. That is, the model data after the correction can be regarded as model data confirmed to be valid. Control device 100 then stores picked up component P in confirmation-necessity storage section 130 as component P having a history (S222) and terminates the present process. As a result, the model data related to picked up component P is stored in confirmation-necessity storage section 130 as model data for which confirmation of validity is unnecessary.

In this way, multiple confirmations of the validity of model data related to component P, which was a new component at the start of component mounting work, can be avoided. In this way, component mounting device 1 improves the productivity of component mounting work. Further, if the model data of being invalid is caused by the component matching error and component P is a non-defective component, component P picked up and held at the time of the temporary interruption of component transfer device 30 is mounted on board K without being discarded. Therefore, it is possible to prevent component P which is a non-defective product from being incorrectly discarded when a component matching error occurs, and therefore, it is possible to suppress an increase in component cost.

In this manner, when a component matching error occurs and confirmation of picked up component P is unnecessary, control device 100 continues normal mounting operation (recovery process) with component transfer device 30. On the other hand, when a component matching error occurs and component P to be picked up requires confirmation, control device 100 temporarily suspends the mounting operation with component transfer device 30 and provides an opportunity to confirm the validity of the model data.

As described above, since the component mounting device 1 does not need to perform a test for confirming the validity of the model data before starting component mounting work, the productivity of the component mounting work can be improved.

Further, in a conventional art in which a test for confirming the validity of component P is performed before starting component mounting work, component P used for the test has been subjected to a discard process, reused by returning component P to the component supply position by the operator, or the like. In this way, execution of the test for confirming the validity of component P becomes a factor in increasing component costs associated with the disposal process and the amount of work associated with reusing component P. On the other hand, in component mounting device 1, since the test for confirming the validity of component P can be omitted, it is possible to avoid an increase in component costs associated with the disposal process and the amount of work associated with reusing component P.

4. Other

Although the present disclosure has been described based on the above-mentioned embodiment, the present disclosure is not limited to the above-mentioned embodiment, and it can be easily inferred that various modifications and improvements can be made within the scope of the present disclosure without departing from the spirit of the present disclosure.

For example, in the embodiment described above, if a processing error occurs, within a series of processes performed, based on model data requiring confirmation, control device 100 waits until the operator responds to the process error. However, the present disclosure is not limited to this, and for example, when a processing error occurs, control device 100 may correct the model data based on a correction program stored in advance without waiting for a response from the operator.

In the above embodiment, pickup errors, component dropped errors, and component matching errors were cited as examples of types of processing errors detected by error determining section 120. However, the present disclosure is not limited to these, and error determining section 120 may be configured to detect other processing errors, such as side face recognition process errors of components, height inspection errors of component leads, errors at the time of mounting a component, and the like.

5. Effects

As described above, component mounting device 1 according to the present disclosure includes component transfer device 30 for holding supplied component P and mounting component P to conveyed board K; an imaging device, as first imaging device 40 or second imaging device 50 for imaging component P or board K; and control device 100 for controlling component transfer device 30. Control device 100 includes model data storage section 110 for storing model data produced based on information about component P; error determining section 120 for determining whether a processing error has occurred in a series of processes from the start of the holding operation of component P to the completion of mounting component P with component transfer device 30; and confirmation-necessity storage section 130 for storing whether confirmation of validity of model data is necessary, when a processing error has occurred in a series of processes performed, based on each piece of model data stored in model data storage section 110.

Further, if it is determined that a processing error has occurred, control device 100 temporarily suspends the mounting operation of component transfer device 30 when the model data related to target component P held by component transfer device 30 needs confirmation based on the stored information in confirmation-necessity storage section 130, while control device 100 continues the mounting operation by component transfer device 30 when the model data stored in confirmation-necessity storage section 130 indicates that confirmation is unnecessary.

According to component mounting device 1, in the course of performing a series of processes from the start of the holding operation of component P to the mounting of component P by component transfer device 30, error determining section 120 determines whether a processing error has occurred. If a processing error occurs in the course of performing a series of processes based on model data that requires confirmation of validity, control device 100 deems the validity of the model data suspect and temporarily suspends the mounting operation by component transfer device 30. This provides an opportunity to confirm the validity of the model data. On the other hand, if the error determining section determines that a process error has not occurred, control device 100 deems the model data to be valid and continues the mounting operation by component transfer device 30.

Therefore, since component mounting device 1 does not need to perform testing to confirm the validity of the model data before starting component mounting work, productivity of the component mounting work is improved.

In component mounting device 1 described above, error determining section 120 compares captured image data of component P, captured by the imaging device, with model data stored in model data storage section 110, and determines that a processing error has occurred if the captured image data does not match the model data. With component mounting device 1, control device 100 can determine whether component P is a non-defective product.

In component mounting device 1 described above, confirmation-necessity storage section 130 stores information about whether each of components P to be mounted by component transfer device 30 is a new component for which component transfer device 30 has no history of mounting. Control device 100 deems the model data related to component P stored as a new component in confirmation-necessity storage section 130 as model data requiring confirmation of validity.

According to component mounting device 1, when a processing error occurs in a series of processes performed based on model data related to component P as a new component, control device 100 deems the validity of the model data as suspect and temporarily suspends the mounting operation by component transfer device 30. This gives an opportunity to confirm the validity of the model data related to the new component P. Therefore, since component mounting device 1 does not need to perform a test for confirming the validity of the model data on component P, which is the new component, before component mounting work is started, productivity of the component mounting work is improved.

In component mounting device 1 described above, when it is determined that a processing error has not occurred in the model data related to component P that requires checking the validity, control device 100 stores the model data related to component P in confirmation-necessity storage section 130 as model data for which confirmation of validity is unnecessary.

With component mounting device 1, if a processing error does not occur when the mounting operation is performed with respect to component P that was a new component at the start time of component mounting work, control device 100 stores the model data related to component P in confirmation-necessity storage section 130 as model data for which confirmation of validity is unnecessary. Therefore, it is possible to avoid performing multiple confirmations of the validity of the model data related to component P which is a new component at the start time of component mounting work. In this way, component mounting device 1 improves the productivity of component mounting work.

In component mounting device 1 described above, when it is determined that a processing error has occurred, control device 100 determines that component P is a defective product, when the model data related to component P held in component transfer device 30 has a history of being mounted before, based on the stored information in confirmation-necessity storage section 130, and performs processing for holding new component P in component transfer device 30 again. In this case, component mounting device 1 improves productivity of the mounting operation.

In component mounting device 1 described above, component transfer device 30 includes suction nozzle 33 which holds component P by suction, and error determining section 120 determines whether a pickup error has occurred between the suction nozzle 33 and component P. When it is determined that a pickup error has occurred, control device 100 temporarily suspends the mounting operation of component transfer device 30 when the model data related to component P requires confirmation of validity or continues the mounting operation of component transfer device 30 when confirmation of validity is unnecessary.

In this case, component mounting device 1 can determine whether a pickup error has occurred. When a pickup error occurs, if the model data related to component P to be picked up is model data requiring confirmation, control device 100 temporarily suspends the mounting operation of component transfer device 30. This provides an opportunity to confirm the validity of the model data. On the other hand, if the model data related to component P to be picked up is model data for which confirmation is unnecessary, the mounting operation by component transfer device 30 is continued.

Therefore, since component mounting device 1 does not need to perform testing to confirm the validity of the model data before starting component mounting work, productivity of the component mounting work is improved.

REFERENCE SIGNS LIST

1: component mounting device 30: component transfer device 33: suction nozzle 40: first imaging device (imaging device), 50: second imaging device (imaging device), 100: control device, 110: model data storage section, 120: error determining section, 130: confirmation-necessity storage section, K: board, P: component

The invention claimed is:

1. A component mounting device, comprising:
    a component transfer device configured to hold a component and mount the component on a conveyed board, the component being one of a plurality of components mounted on the conveyed board,
    an imaging device configured to image the component or the board, and
    a control device configured to control the component transfer device, the control device including:
        a model data storage section configured to store model data produced based on information about each of the plurality of components, the model data includes image data indicating an outer shape of a component of the plurality of components;
        an error determining section configured to determine whether a processing error has occurred in a series of processes from the start of the holding operation of the component to the completion of mounting, wherein the processing error is at least one of a component pickup error, a component dropped error or a component matching error, and wherein the component matching error is detected by comparing the model data with the image data of the component when picked up and held by a suction nozzle, and wherein the component pickup error and the component dropped error are detected by a change in a negative pressure or a flow rate of the suction nozzle, and
        a confirmation-necessity storage section configured to store information about whether confirmation of validity of the model data is necessary for each component of the plurality of components when a processing error has occurred in the series of processes performed based on each piece of model data stored in the model data storage section, wherein,
    when the control device determines that the processing error has occurred and the component held by the component transfer device during the processing error is registered in the confirmation-necessary storage section as a component that confirmation of validity of the model data is necessary, the control device temporarily suspends the mounting operation by the component transfer device and indicates on a display that validity of the component is necessary, and
    when the control device determines that the processing error has occurred and the component held by the component transfer device during the processing error is registered in the confirmation-necessary storage section as a component that confirmation of validity of the model data is not necessary, the control device continues the mounting operation by the component transfer device.

2. The component mounting device according to claim 1, wherein
    the error determining section is configured to reference imaging data of the component imaged by the imaging device with the image data of the model data stored in the model data storage section and determine that a processing error has occurred when the imaging data and the model data do not match.

3. The component mounting device according to claim 2, wherein
    the component is registered in the confirmation-necessity storage section when the component is a new component without having a history of being mounted before by the component transfer device.

4. The component mounting device according to claim 2, wherein
    when it is determined that the processing error has not occurred and the component is registered in the confirmation-necessity storage section as a component that the confirmation of validity of the model data is necessary, the control device updates the confirmation-necessity storage section so that the component held by the component transfer device during the processing error is a component for which confirmation of validity is not necessary.

5. The component mounting device according to claim 3, wherein
    when it is determined that the processing error has occurred, the control device determines that the component is a defective product in a case of the model data, which is related to the component held in the component transfer device and is stored in the confirmation necessity storage section, having a history of being mounted before, and performs processing for holding the component in the component transfer device again.

6. The component mounting device according to claim 1, wherein
    the component transfer device includes the suction nozzle for holding the component by suction,
    the error determining section determines whether a pickup error has occurred between the suction nozzle and the component, and
    when it is determined that the pickup error has occurred, the control device temporarily suspends the mounting operation by the component transfer device in a case of the model data, which is related to the component, requiring a validity confirmation, or continues the mounting operation by the component transfer device in a case of the validity confirmation being unnecessary.

* * * * *